(12) United States Patent
Yamagishi

(10) Patent No.: US 6,955,741 B2
(45) Date of Patent: Oct. 18, 2005

(54) SEMICONDUCTOR-PROCESSING REACTION CHAMBER

(75) Inventor: Takayuki Yamagishi, Tokyo (JP)

(73) Assignee: ASM Japan K.K. (JP)

(*) Notice: Subject to any disclaimer, the term of this patent is extended or adjusted under 35 U.S.C. 154(b) by 46 days.

(21) Appl. No.: 10/214,890

(22) Filed: Aug. 7, 2002

(65) Prior Publication Data
US 2004/0026041 A1 Feb. 12, 2004

(30) Foreign Application Priority Data
Aug. 8, 2001 (JP) ......................... 2001-240732

(51) Int. Cl.$^7$ .......................... H01L 21/00; C23C 16/00
(52) U.S. Cl. .......................... 156/345.51; 156/345.52; 156/345.53; 118/715; 118/724; 118/725; 118/728; 204/298.01; 204/298.02; 204/298.31
(58) Field of Search ................... 156/345.51, 345.52, 156/345.53; 118/715–730, 500; 204/298.01, 298.02, 298.03

(56) References Cited

U.S. PATENT DOCUMENTS

| | | | |
|---|---|---|---|
| 4,134,255 A | * 1/1979 | McBain et al. ................. 59/78 |
| 4,724,621 A | 2/1988 | Hobson et al. ................. 34/218 |
| 4,764,076 A | 8/1988 | Layman et al. ................. 414/217 |
| 4,790,258 A | 12/1988 | Drage et al. ................. 118/500 |
| 4,842,683 A | 6/1989 | Cheng et al. ................. 156/345 |
| 4,902,531 A | 2/1990 | Nakayama et al. ............ 427/39 |
| 4,908,095 A | 3/1990 | Kagatsume et al. ........ 156/643 |
| 4,951,601 A | 8/1990 | Maydan et al. ............. 118/719 |
| 5,034,199 A | 7/1991 | Zavracky et al. ............ 422/245 |
| 5,060,354 A | 10/1991 | Chizinsky ................... 29/25.02 |
| 5,100,502 A | 3/1992 | Murdoch et al. ............ 156/643 |
| 5,199,483 A | 4/1993 | Bahng ......................... 165/1 |
| 5,226,056 A | 7/1993 | Kikuchi et al. ............... 373/18 |
| 5,252,807 A | 10/1993 | Chizinsky ................... 219/390 |
| 5,310,453 A | 5/1994 | Fukasawa et al. ........... 156/643 |
| 5,352,294 A | 10/1994 | White et al. ................ 118/725 |
| 5,366,002 A | 11/1994 | Tepman ......................... 165/1 |
| 5,444,217 A | 8/1995 | Moore et al. ................ 219/405 |
| 5,460,684 A | 10/1995 | Saeki et al. .................. 156/345 |
| 5,516,367 A | 5/1996 | Lei et al. ..................... 118/725 |
| 5,556,476 A | 9/1996 | Lei et al. ..................... 118/728 |
| 5,558,736 A | 9/1996 | Lee et al. ..................... 156/345 |
| 5,566,744 A | 10/1996 | Tepman ....................... 165/80.1 |
| 5,589,224 A | 12/1996 | Tepman et al. ........... 427/248.1 |
| 5,611,865 A | 3/1997 | White et al. ................ 118/725 |
| 5,665,166 A | 9/1997 | Deguchi et al. .......... 118/723 E |
| 5,683,518 A | 11/1997 | Moore et al. ............... 118/730 |
| 5,695,568 A | 12/1997 | Sinha et al. ................ 118/729 |
| 5,710,407 A | 1/1998 | Moore et al. ............... 219/405 |
| 5,800,686 A | 9/1998 | Littau et al. ........... 204/298.07 |
| 5,856,240 A | 1/1999 | Sinha et al. ................ 438/758 |
| 5,882,419 A | 3/1999 | Sinha et al. ................ 118/729 |
| 5,935,338 A | 8/1999 | Lei et al. ..................... 118/725 |
| 5,994,678 A | 11/1999 | Zhao et al. .................. 219/530 |
| 6,113,704 A | 9/2000 | Satoh et al. ................ 118/728 |
| 6,146,463 A | * 11/2000 | Yudovsky et al. .......... 118/729 |
| 6,374,508 B1 | 4/2002 | Yudovsky et al. ............ 33/645 |
| 6,416,647 B1 | * 7/2002 | Dordi et al. ................ 205/137 |

FOREIGN PATENT DOCUMENTS

JP 288992632 10/1999
JP 2001135713 A * 5/2001 ........... H01L/21/68

* cited by examiner

Primary Examiner—Gregory Mills
Assistant Examiner—Ram N Kackar
(74) Attorney, Agent, or Firm—Knobbe, Martens, Olson & Bear LLP

(57) ABSTRACT

The present application provides a PECVD reaction chamber for processing semiconductor wafers comprising a susceptor for supporting a semiconductor wafer inside the reaction chamber wherein the susceptor comprises a plurality vertical through-bores, a moving means for moving the susceptor vertically between at least a first position and a second position, wafer-lift pins passing through the through-bores wherein the lower end of each wafer pin is attached to a lift member, and a lift member linked with an elevating mechanism for moving the wafer-lift pins vertically. The disclosed apparatus reduces contamination on the underside of the semiconductor wafer.

2 Claims, 3 Drawing Sheets

SEMICONDUCTOR-PROCESSING REACTION CHAMBER

TECHNICAL FIELD OF THE INVENTION

The present application relates to a reaction chamber for processing semiconductor wafers, and in particular, to wafer-supporting pins for lifting semiconductor wafers inside a reaction chamber.

BACKGROUND OF THE INVENTION

Currently, most semiconductor processing devices are single-wafer-devices processing type devices which process semiconductor wafers sheet by sheet. These single-wafer-processing type devices generally possess a susceptor inside a reaction chamber on which processing is performed while heating semiconductor wafers at a given temperature on the susceptor.

A typical susceptor in a single-wafer-processing type device comprises a disc-shaped body made of metal or ceramic having high heat conductivity, and has a built-in heating element such as an electric heater. This type of susceptor has at least three through-bores into which substrate-supporting pins are inserted vertically such that the pins can move freely. When an external transfer device carries a semiconductor wafer into the reaction chamber, the substrate-supporting pins extend upwards from the through-bores to receive the semiconductor wafer. The substrate-supporting pins then retract, setting the semiconductor wafer onto the susceptor.

When removing a processed semiconductor wafer from the reaction chamber, the substrate-supporting pins reextend from the through-bores, supporting the semiconductor wafer, whereupon the transfer device carries the semiconductor wafer out of the reaction chamber.

To extend and retract the substrate-supporting pins out of and into the through-bores of the susceptor, a horizontal support engaging the lower end of each substrate-supporting pin is provided immediately beneath the susceptor. This horizontal support is raised and lowered by a driving device such as an air cylinder.

The through-bores are typically provided on the inward side away from the periphery of a semiconductor wafer, and are blocked off from the processing environment by the semiconductor wafer during the semiconductor wafer processing.

In ultrafine and high-density semiconductor devices, particle contamination on the back of the semiconductor wafer is a problem. Conventional substrate-supporting pins directly contact the back of the semiconductor wafer. Particles often adhere to the back of the wafer at these points of contact.

The head of the wafer-supporting pin may be tapered to block-off the through-bore of the susceptor. Because the wafer-supporting pin is seated solely by its own weight, the pin may bind and not properly seat.

If the wafer-supporting pin is situated at the periphery of the semiconductor wafer, a step in the head of the wafer-supporting pin must be provided to hold the edge of the semiconductor wafer, necessitating a whirl-stop.

SUMMARY OF THE INVENTION

One preferred embodiment of the present invention provides a reaction chamber with substrate-supporting pins that stably raise and lower a semiconductor wafer without the substrate-supporting pin getting caught.

A second embodiment provides a reaction chamber with substrate-supporting pins having a reduced contact area with the semiconductor wafer to minimize particle contamination.

A third embodiment provides a reaction chamber with substrate-supporting pins that block off the through-bores from reaction gases during semiconductor wafer processing.

A reaction chamber for processing semiconductor wafers according to the present invention comprises:

a susceptor for supporting a semiconductor wafer inside the reaction chamber wherein the susceptor comprises a plurality vertical through-bores, a moving means for moving the susceptor vertically between at least a first position and a second position, wafer-lift pins passing through the through-bores wherein the lower end of each wafer pin is attached to a lift member, and a lift member linked with an elevating mechanism for moving the wafer-lift pins vertically.

Preferably, a wafer-lift pin comprises a head with a columnar shape and a columnar body with a diameter smaller than that of the head forming a step between the head and the body.

Preferably, the top of the head of the wafer-lift pin has a step for engaging the edge of a semiconductor wafer.

Preferably, the disclosed mechanism comprises an elastic member to which the lift member is dynamically connected.

The elevating mechanism comprises a power source and a power transmission means. The power source is a cylinder driven electrically or pneumatically.

DETAILED DESCRIPTION OF THE PREFERRED EMBODIMENTS

Figure 1:
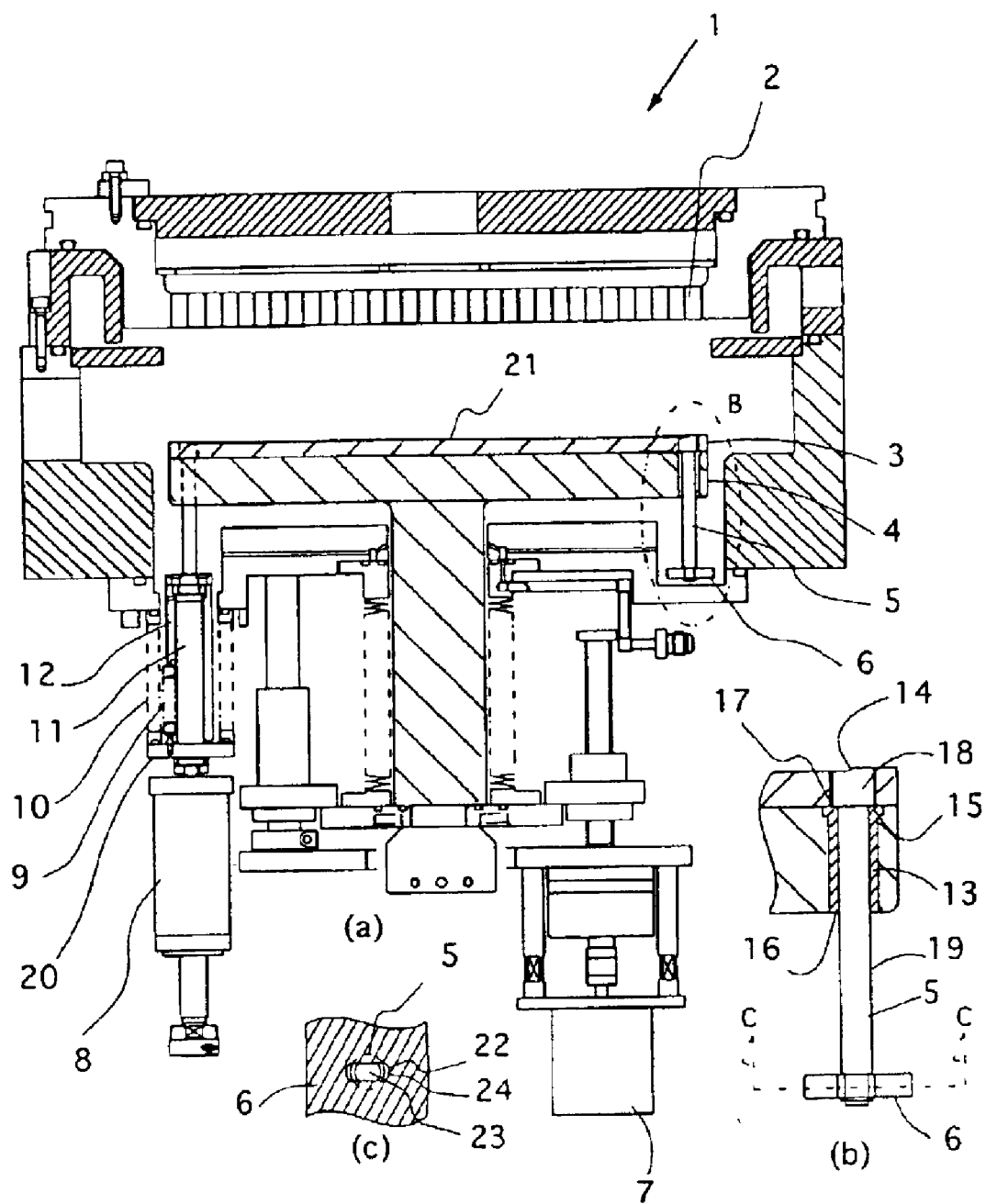
FIG. 1(a) is a cross section of a preferred embodiment of a reaction chamber.
FIG. 1(b) is an detail view of area "B" of FIG. 1(a).
FIG. 1(c) is a cross section of FIG. 1(b) across section "C".

The present invention is described in detail by reference to the accompanying figures. FIG. 1(a) provides a cross section of a preferred embodiment of a reaction chamber according to the present invention. FIG. 1(b) is a detail view of area "B" of FIG. 1(a). Inside the reaction chamber 1, a disk-shaped susceptor 4 for supporting a semiconductor wafer is provided. Above the susceptor 4, a shower plate 2 for emitting a jet of reaction gas toward the semiconductor wafer is provided facing the susceptor 4. In plasma-enhanced CVD (PECVD), both the susceptor and the shower plate comprise electrodes of a high-frequency power source. The susceptor 4 is raised and lowered by a susceptor drive motor 7. During the deposition process, the susceptor 4 is raised to provide a reduced reaction area (see FIG. 3).

On the surface of the susceptor 4, a top plate 3 having about the same diameter as the susceptor is installed. The top plate 3 is preferably made of ceramic or aluminum. In an alternative embodiment, a top plate is unnecessary.

Near the periphery of the susceptor 4 and the top plate 3, at least three through-bores 16 are formed vertically at roughly even intervals. Preferably, the through-bores 16 each have a diameter of from about 10 mm to about 15 mm in the top plate 3, and a diameter of about 6 mm to about 10 mm in the susceptor 4. The diameter of the through-bore 16 is preferably larger in the top plate 3 than in the susceptor 4. A shoulder portion 17 is formed at the boundary between the top plate 3 and the susceptor 4.

Inside the through-bore 16, a wafer-lift pin 5 is inserted. The wafer-lift pin 5 comprises a head 18 with a columnar shape and a columnar body 19 with a diameter smaller than the diameter of the head 18. The diameter of the head 18 preferably is slightly smaller than the diameter of the through-bore in the top plate. The diameter of the body 19 is preferably slightly smaller than the diameter of through-bore in the susceptor. The wafer-lift pin 5 is preferably ceramic, for example $Al_2O_3$ or AlN. Preferably, a bushing 13 is installed in the gap between the body 19 of the wafer-lift pin 5 and the through-bore 16. Bushing 13 is preferably ceramic, for example $Al_2O_3$ or AlN. The bushing prevents binding of the wafer-lift pin 5 in the susceptor 4 at high temperatures if the susceptor 4 is aluminum. A step 15 is formed between the head 18 and the body 19 of the wafer-lift pin 5. The step 15 engages with the shoulder portion 17 of the through-bore 16. On the top surface of the head 18 of the wafer-lift pin 5, a step 14 is provided to engage the edge a semiconductor wafer. Preferably, the surface shape of the head 18 conforms with or is similar to the surface shape of the top plate 3. Accordingly, the head 18 is minimally affected by deposition.

FIG. 1(c) is a cross section of FIG. 1(b) along section "C". In one preferred embodiment, the lower end 23 of the body 19 of the wafer-lift pin has flattened profile. The lower end 23 is slidably engaged in a corresponding hole 22 provided in a toric wafer-lift bar 6, preventing rotation of the wafer-lift pin 5. The hole 22 of the wafer-lift bar 6 is elongated 24 to accommodate movement of the wafer-lift pin 5 from thermal expansion of the susceptor 4.

Accordingly, binding of the wafer-lift pin 5 inside the through-bore 16 is eliminated. Furthermore, because the wafer-lift pin 5 does not rotate, the orientation of step 14 on the head 18 does not vary, thus maintaining engagement with the edge of the semiconductor wafer.

The wafer-lift bar 6 is raised and lowered by an elevating mechanism. The elevating mechanism preferably comprises a power source 8, driven electrically or pneumatically, and a power transmission portion that transmits the vertical motion from power source 8 to the wafer-lift bar 6. The transmission portion comprises a vertically extending cylinder 12 joined with the wafer-lift bar 6, a piston 11 inserted into the cylinder 12, and an elevating plate 20, joined to the lower end of the piston 11, which transmits the vertical motion from the power source 8 to the piston 11. The transmission portion is preferably isolated by bellows 10. As described below, between the cylinder 12 and the elevating plate 20, is provided a spring 9.

Figure 2:
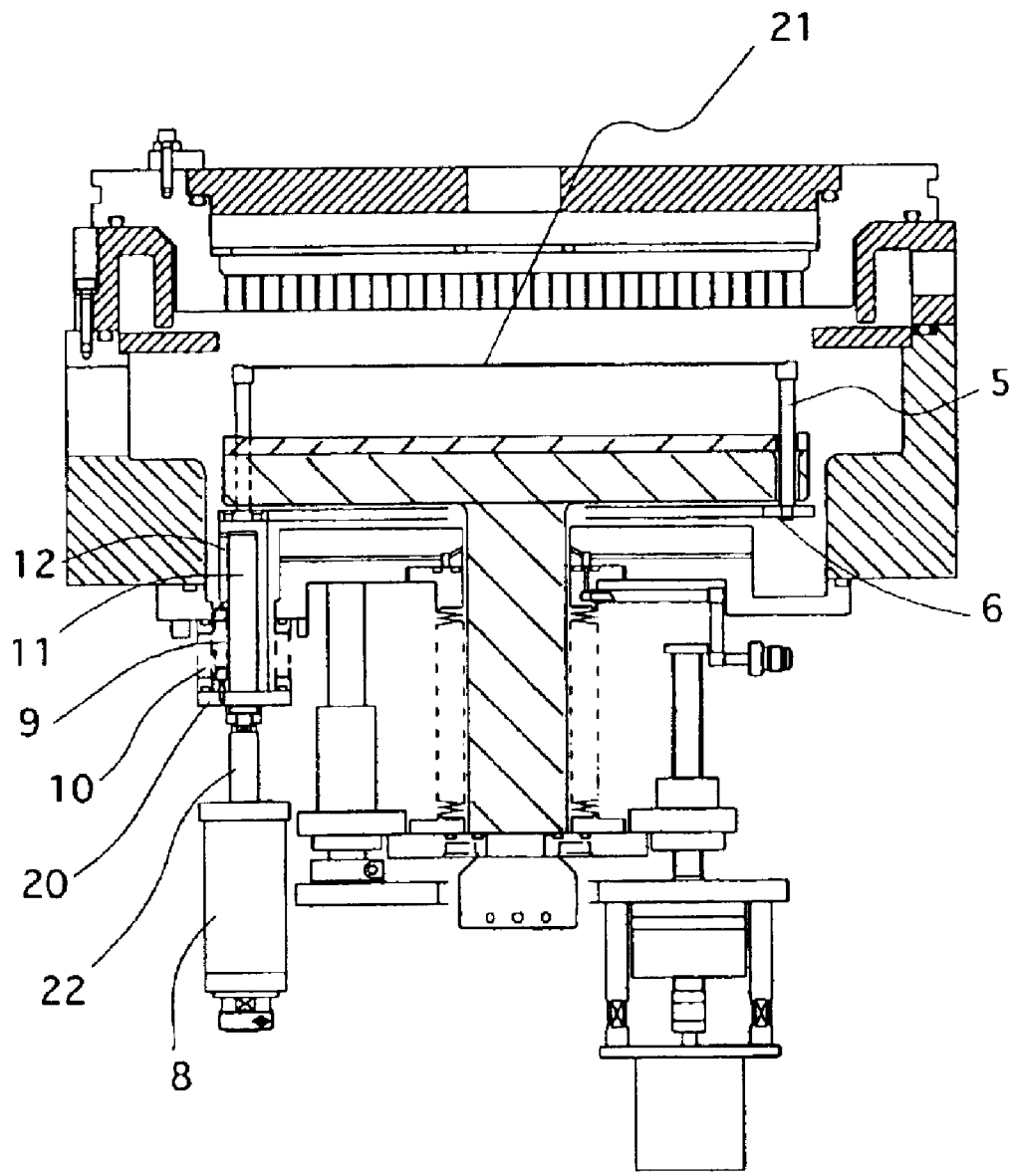
FIG. 2 is a cross section of a preferred embodiment of a reaction chamber in which the wafer is raised by the wafer supporting pins.

FIG. 2 depicts the wafer-lift pins 5 in their extended positions supporting the semiconductor wafer 21. A shaft 22 extending from the power source 8 raises the elevating plate 20. As the piston 11 is raised, the elevating plate 20 at the lower end of the piston 11 and the lower end surface of the cylinder 12 contact, raising the cylinder 12. As the cylinder 12 rises, the wafer-lift bar 6 rises, and the wafer-lift pin 5 extends from the surface of the susceptor 4. Simultaneously, the bellows 10 and the spring 9 are compressed. The semiconductor wafer edge-contacting the step 14 of the head 18 of the wafer-lift pin 5 minimizes contamination.

Figure 3:
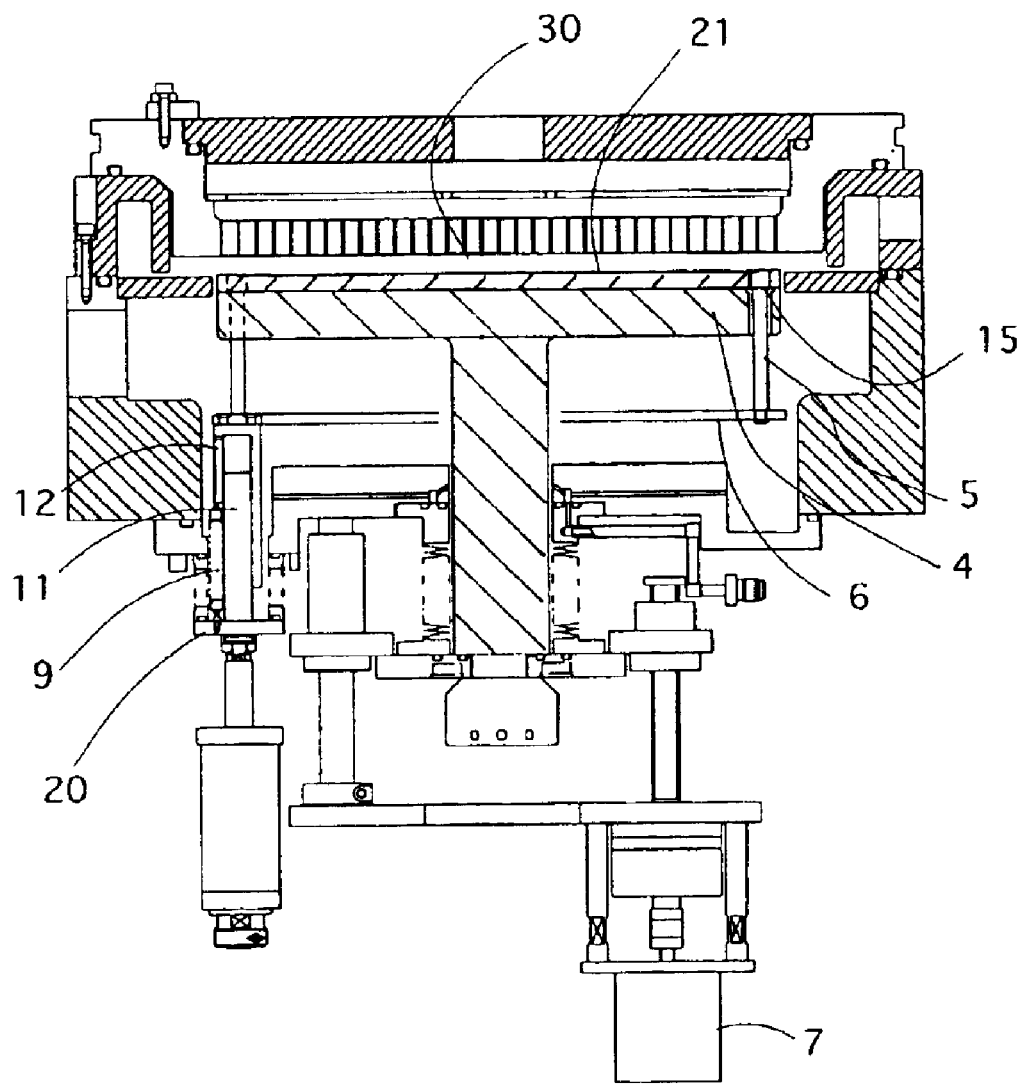
FIG. 3 is a cross section of a preferred embodiment of a reaction chamber during a deposition on a semiconductor wafer.

FIG. 3 depicts a reaction chamber during deposition on a semiconductor wafer 21. From the position shown in FIG. 2, the susceptor 4 is raised by the susceptor drive motor 7. The distance 30 between the shower plate 2 and the susceptor 4 is preferably adjusted to about 10 mm to about 20 mm. As the susceptor 4 rises, the step 15 of the wafer-lift pin 5 engages the shoulder portion 17 of the through-bore 16 raising the wafer-lift pin 5. The wafer-lift bar 6 also rises with the wafer-lift pin 5, pulling up the cylinder 12. The engagement between the cylinder 12 with the piston 11 is broken, allowing the cylinder 12 to rise. Because the position of the elevating plate 20 does not change, the spring 9 provided between the cylinder 12 and the elevating plate 20 stretches. The tension of the spring 9 is transmitted through the cylinder 12 and the wafer-lift bar 6 to the wafer-lift pin 5 engaging the step 15 of the wafer-lift pin 5 to the shoulder portion 17 of the throughhole 16, and preventing reaction gases from entering the through-bore 16 of the susceptor 4.

The embodiments illustrated and described above are provided as example of certain preferred embodiments of the present invention. Various changes and modifications can be made to the embodiments presented herein by those skilled in the art without departure from the spirit and scope of this invention, the scope of which is limited only the claims appended hereto.

What is claimed is:

1. A reaction chamber for processing semiconductor wafers comprising:
    a support surface for supporting a semiconductor wafer inside the reaction chamber wherein the support surface comprises a plurality vertical through-bores,
    wafer-lift pins passing through the through-bores wherein a wafer-lift pin comprises
        a head comprising a top and
        a body comprising a lower end,
    a lift member linked with an elevating mechanism for moving the wafer-lift pins vertically between at least an extended position and a retracted position,
        wherein the lower ends of the wafer-lift pins are attached to the lift member, and
        wherein in the retracted position, the tops of the heads of the wafer-lift pins are substantially flush with the support surface, and
    an elastic component dynamically connected to the lift member, wherein the elastic component biases the lift member towards the retracted position;
    wherein the head of the wafer-lift pin has a columnar shape and the body is columnar with a diameter smaller than that of the head, and a first step at the boundary between the head and the body, and
    wherein the lower end of the body of the wafer-lift pin has a flattened profile engaged in a correspondingly shaped hole in the lift member, the combination of which prevents rotation of the wafer-lift pin.

2. The reaction chamber of claim 1 wherein the hole of the lift member is elongated to accommodate movement of the wafer-lift pin caused by thermal expansion of the support surface.

* * * * *